United States Patent
Takanezawa et al.

(10) Patent No.: US 12,429,514 B2
(45) Date of Patent: Sep. 30, 2025

(54) PARTIAL DISCHARGE MEASUREMENT SYSTEM THAT INCLUDES A FIRST BANDPASS FILTER AND A SECOND BANDPASS FILTER AND PARTIAL DISCHARGE MEASUREMENT METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Makoto Takanezawa, Yokohama (JP); Takashi Harakawa, Yokohama (JP); Akira Fujimoto, Yokohama (JP); Satoshi Hiroshima, Mie (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 213 days.

(21) Appl. No.: 18/348,884

(22) Filed: Jul. 7, 2023

(65) Prior Publication Data
US 2023/0349965 A1 Nov. 2, 2023

Related U.S. Application Data

(63) Continuation of application No. PCT/JP2022/005627, filed on Feb. 14, 2022.

(30) Foreign Application Priority Data

Feb. 16, 2021 (JP) .................................. 2021-022341

(51) Int. Cl.
*G01R 31/12* (2020.01)
*G01R 31/34* (2020.01)

(52) U.S. Cl.
CPC ............. *G01R 31/12* (2013.01); *G01R 31/34* (2013.01)

(58) Field of Classification Search
CPC ........ G01R 31/08; G01R 31/14; G01R 31/12; G01R 31/1272; G01R 31/086;
(Continued)

(56) References Cited

U.S. PATENT DOCUMENTS 3,991,365 A * 11/1976 Takeuchi ................. A61B 8/02
324/76.23
6,538,450 B2 * 3/2003 Bussinger ............ G01R 31/083
324/516
(Continued)

FOREIGN PATENT DOCUMENTS

JP 07-146324 A 6/1995
JP 9-80111 A 3/1997
(Continued)

OTHER PUBLICATIONS

International Search Report issued Apr. 5, 2022 in PCT/JP2022/005627 filed on Feb. 14, 2022 2 pages.

*Primary Examiner* — Vinh P Nguyen
(74) *Attorney, Agent, or Firm* — Oblon, McClelland, Maier & Neustadt, L.L.P.

(57) ABSTRACT

A partial discharge measurement system including at least one sensor configured to detect a voltage signal propagating through a conductor connected to a rotating electrical machine in a non-contact manner, a first bandpass filter configured to pass a component of a first frequency included in the voltage signal therethrough, a second bandpass filter configured to pass a component of a second frequency included in the voltage signal therethrough, the second frequency being lower than the first frequency, a phase acquirer configured to acquire a phase waveform of the component of the second frequency having passed through the second bandpass filter, and an output interface configured to output information by which a component of partial discharge of the rotating electrical machine included in the component of the first frequency having passed through the first bandpass filter can be identified based on the phase waveform.

11 Claims, 8 Drawing Sheets

(58) Field of Classification Search
CPC ...... G01R 23/00; G01R 31/00; G01R 15/142; G01R 31/3275; G01R 31/34; G01R 19/0084; G01R 15/16; G01R 23/165; G01R 23/15; G01R 25/00; G01R 29/027; G01R 29/18; G01R 23/12; G01R 31/58; G01R 31/1245; G01R 31/11; H04B 17/00; H04B 3/46; H04B 2203/5495; G06F 17/148; G06F 17/18; G05B 23/0208; H03K 3/86
See application file for complete search history.

(56) References Cited

U.S. PATENT DOCUMENTS

| | | | |
|---|---|---|---|
| 7,388,384 B2* | 6/2008 | Kato | G01R 31/1254 324/536 |
| 8,669,773 B2* | 3/2014 | Klapper | G01R 35/005 324/750.02 |
| 9,612,271 B2* | 4/2017 | Cern | G01R 31/083 |
| 10,180,451 B2* | 1/2019 | Schweitzer, III | G01R 19/0084 |
| 11,579,180 B2* | 2/2023 | Harakawa | G01R 31/343 |
| 2005/0184737 A1 | 8/2005 | Moriyama et al. | |
| 2007/0139056 A1 | 6/2007 | Kaneiwa et al. | |
| 2021/0373065 A1 | 12/2021 | Takami et al. | |

FOREIGN PATENT DOCUMENTS

| | | |
|---|---|---|
| JP | 10-288639 A | 10/1998 |
| JP | 2005-233837 A | 9/2005 |
| JP | 2006-058166 A | 3/2006 |
| JP | 2006-064461 A | 3/2006 |
| JP | 2006-98270 A | 4/2006 |
| JP | 2008-215864 A | 9/2008 |
| JP | 2018-059848 A | 4/2018 |
| JP | 2018-072304 A | 5/2018 |
| JP | 2019-200068 A | 11/2019 |
| KR | 10-1333584 B1 | 11/2013 |
| WO | WO 2020/121600 A1 | 6/2020 |

* cited by examiner

PARTIAL DISCHARGE MEASUREMENT SYSTEM THAT INCLUDES A FIRST BANDPASS FILTER AND A SECOND BANDPASS FILTER AND PARTIAL DISCHARGE MEASUREMENT METHOD

CROSS-REFERENCE TO RELATED APPLICATIONS

This application is a Continuation Application of No. PCT/JP2022/005627, filed on Feb. 14, 2022, and the PCT application is based upon and claims the benefit of priority from Japanese Patent Application No. 2021-022341, filed on Feb. 16, 2021, the entire contents of which are incorporated herein by reference.

TECHNICAL FIELD

Embodiments of the present invention relate to a technique for measuring partial electric discharge.

BACKGROUND

An insulating material is used in a rotating electrical machine. If the insulating material deteriorates due to thermal, electrical, mechanical, or chemical stress, dielectric breakdown may occur, which leads to a failure of the rotating electrical machine. Thus, it is important to grasp the state of the insulating material for ensuring reliability of the rotating electrical machine. In power generators for business and private use and high-voltage motors for industrial use, high voltage is applied to coils and thereby partial discharge occurs in a void inside the insulating material or on the surface of the insulating material, which causes discharge erosion of resin and the like. For this reason, long-term reliability of the insulating material is ensured by using an insulating material containing mica with high discharge resistance for suppressing discharge erosion.

In order to grasp the state of the insulating material and check its normality, if the rotating electrical machine is in the state of being stopped, the state and normality can be comprehensively determined by offline diagnosis of insulation resistance, dielectric loss, partial discharge, and the like. However, stopping the rotating electrical machine has a large impact on business and the offline diagnosis is diagnosis while the machine is stopped, and thus, all the events supposed to occur during operation are not necessarily represented in some cases. Due to these circumstances, there is a demand for online diagnosis that can be performed while the rotating electrical machine is in operation. Online diagnosis using partial discharge or electric current measurement is also implemented.

The online diagnosis, in which partial discharge is measured, can be installed without contact with a high-voltage component of electrical equipment by using an electromagnetic wave antenna. Thus, it is relatively easy to install a sensor, and there are advantages such as less electrical or mechanical stress to be applied to the sensor. In addition, in the case of diagnosing the measured partial discharge signal, relationship with the voltage phase at the time of detecting the partial discharge signal can be determined by simultaneously measuring the voltage waveform applied to the target equipment, which allows estimation of the insulation portion and the phase where the partial discharge occurs in the equipment. Hence, measurement of the voltage phase is necessary for the insulation diagnosis.

PRIOR ART DOCUMENT

Patent Document

[Patent Document 1] JP 2006-058166 A
[Patent Document 2] JP 2006-064461 A
[Patent Document 3] JP 2018-059848 A
[Patent Document 4] JP 2018-072304 A

SUMMARY

Problems to be Solved by Invention

In the insulation diagnosis of the rotating electrical machine, the occurrence location of the partial discharge or the state of the partial discharge can be identified by acquiring the partial discharge signal and a reference voltage phase. In the conventional technology, in order to acquire the reference voltage phase, an acquisition circuit provided with an instrument transformer is further provided. However, at the time of connecting the instrument transformer to the rotating electrical machine, the existing rotating electrical machine needs to be modified, which requires cost and labor. Further, the location to be connected to the instrument transformer is a power supply circuit that is directly connected to a control system and is necessary for the operation of the rotating electrical machine such as an AVR and a relay. Thus, if a failure such as a short circuit and a ground fault occurs in the acquisition circuit, it may adversely affect the rotating electrical machine or the control system via the instrument transformer, and there is a risk of shutdown.

In view of the above-described circumstances, an object of embodiments of the present invention is to provide a partial discharge measurement technique by which partial discharge can be measured without affecting the operation of the rotating electrical machine.

DETAILED DESCRIPTION

In one embodiment of the present invention, a partial discharge measurement system comprising: at least one sensor configured to detect a voltage signal propagating through a conductor connected to a rotating electrical machine in a non-contact manner; a first bandpass filter through which a component of a first frequency included in the voltage signal acquired by the sensor passes; a second bandpass filter through which a component of a second frequency included in the voltage signal acquired by the sensor passes, the second frequency being lower than the first frequency; a phase acquirer configured to acquire a phase waveform of the component of the second frequency having passed through the second bandpass filter; and an output interface configured to output information by which a component of partial discharge of the rotating electrical machine included in the component of the first frequency having passed through the first bandpass filter can be identified based on the phase waveform.

According to embodiments of the present invention, it is possible to provide a partial discharge measurement technique by which partial discharge can be measured without affecting the operation of the rotating electrical machine.

(First Embodiment) Hereinbelow, embodiments of a partial discharge measurement system and a partial discharge measurement method will be described in detail by referring to the accompanying drawings. First, the partial discharge measurement system and the partial discharge measurement method according to the first embodiment will be described by using FIG. 1 to FIG. 5.

Figure 1:
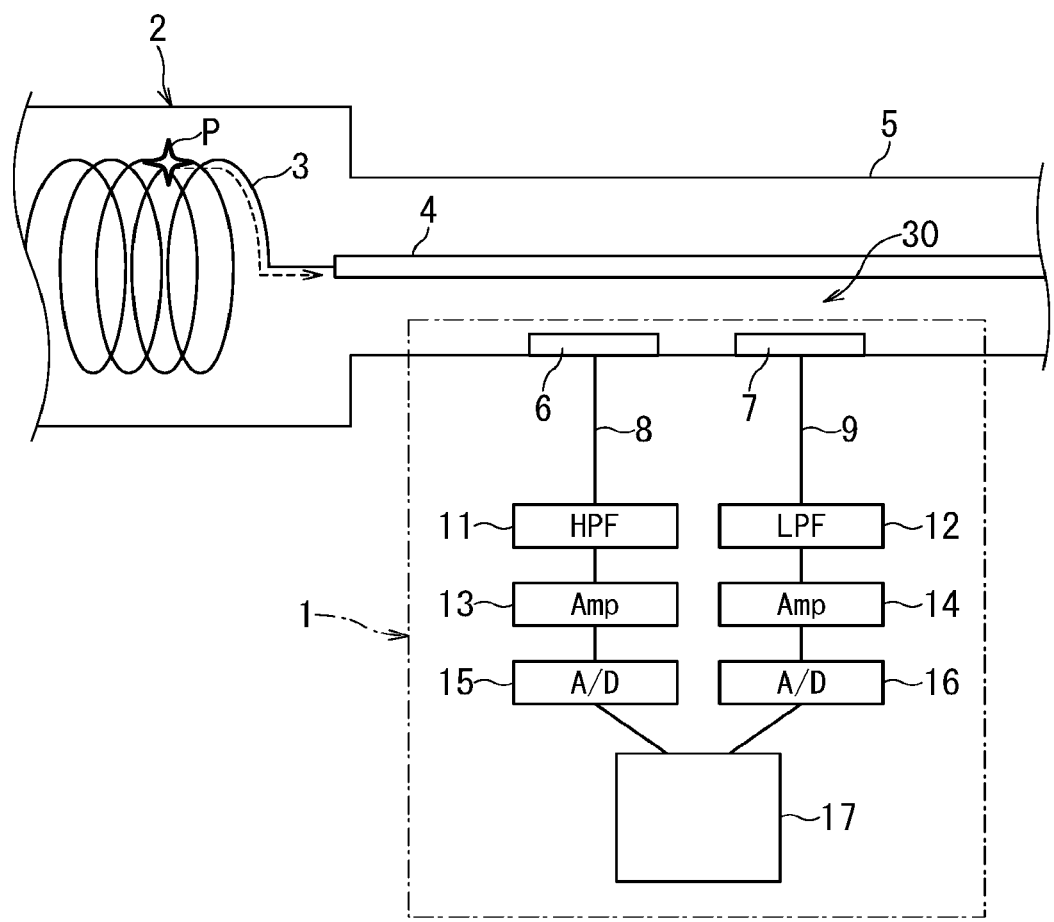
FIG. 1 is a configuration diagram illustrating a partial discharge measurement system according to the first embodiment.

The reference sign 1 in FIG. 1 denotes the partial discharge measurement system according to the first embodiment. This partial discharge measurement system 1 is used to perform non-contact online partial discharge diagnosis for a rotating electrical machine 2.

The partial discharge diagnosis is a test in which electric discharge generated between a conductor constituting equipment and a ground point is detected at the time of applying a high voltage to the conductor. This (electric) discharge often occurs at defects such as a void and separation of an insulating material. At this time, electrons are moving, and thus, a high-frequency electric-current change propagates through the conductor as a signal. In the partial discharge diagnosis, discharge amount and discharge intensity are measured by detecting the change in electric current.

The rotating electrical machine 2 that is the target of the partial discharge measurement is, for example, a generator or an electric motor. The present embodiment can be applied regardless of whether the rotating electrical machine 2 is the generator or the electric motor.

In the following description, the term "frequency of a commercial power supply" indicates the frequency of electric power to be outputted from the rotating electrical machine 2 or the frequency of electric power to be supplied to the rotating electrical machine 2. For example, when the rotating electrical machine 2 is the generator, it is the frequency of the alternating current to be outputted from this generator to the outside. When the rotating electrical machine 2 is the electric motor, it is the frequency of the alternating current to be supplied to this electric motor from the outside. In the following, unless otherwise specifically noted, a description will be given of the case where the rotating electrical machine 2 is the generator.

The rotating electrical machine 2 is composed of: metal materials such as copper and iron, which are conductors; and an insulating material, main material of which is resin. For example, the rotating electrical machine 2 includes a coil 3 as a conductor. A power line 4 as a conductor is connected to this coil 3. The power line 4 is provided, for example, inside a cylindrical metal frame 5. Although the power line 4 is illustrated as a conductor in the present embodiment, this conductor may be a neutral-point lead wire.

For example, when partial discharge P occurs in the coil 3, a voltage signal including information of this partial discharge P is transmitted from the coil 3 to the power line 4 and propagates through the power line 4. Insulation diagnosis of the rotating electrical machine 2 can be performed by detecting the voltage signal propagating through the power line 4. Further, the partial discharge measurement system 1 can diagnose a residual life of the rotating electrical machine 2 by measuring charge amount (i.e., amount of electric charge) related to the partial discharge P. For example, the partial discharge measurement system 1 diagnoses the residual life of the rotating electrical machine 2 by measuring the charge amount related to the partial discharge P.

Figure 5:
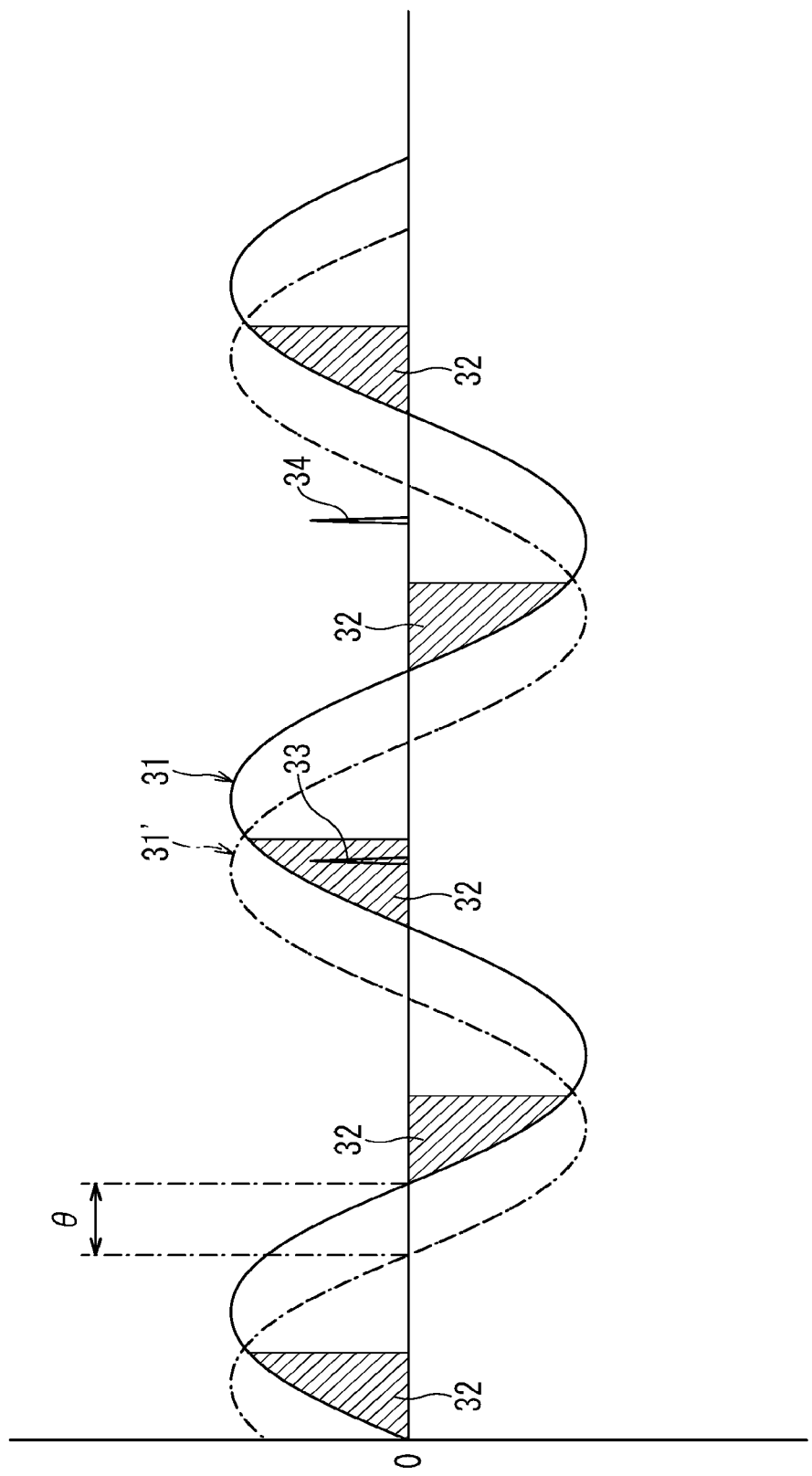
FIG. 5 is a graph illustrating a waveform of a voltage signal detected by a sensor.

As shown in FIG. 5, the timing at which the partial discharge P occurs corresponds to a phase waveform 31 of the frequency of the commercial power supply to be outputted by the rotating electrical machine 2. For example, in the phase waveform 31 of the AC commercial power supply, in the region 32 where the voltage rises (i.e., hatched region in FIG. 5), the voltage to be applied to the insulating material of the rotating electrical machine 2 increases. Thus, if the insulating material includes a dielectric breakdown path such as a void, the partial discharge P tends to occur in the region 32 where the voltage rises. The term "voltage rises" includes a meaning that the voltage rises in the negative direction in alternating current.

When a pulse signal 33 is detected corresponding to the region 32 where the voltage of the phase waveform 31 of the commercial power supply rises, there is a high possibility that this pulse signal 33 is ascribable to the partial discharge P. When a pulse signal 34 is detected regardless of the region 32 where the voltage rises, there is a high possibility that this pulse signal 34 is caused by noise. In other words, the pulse signal 33 of the partial discharge P can be distinguished from the pulse signal 34 of noise by acquiring the phase waveform 31 (i.e., reference voltage phase) of the commercial power supply.

In addition, the occurrence location of the partial discharge or the state of the partial discharge can be identified by acquiring the pulse signal 33 of the partial discharge P and the phase waveform 31 of the commercial power supply. For example, in the case of three-phase alternating current, the coil 3 where the partial discharge P is generated can be identified by determining which of the three phase waveforms the pulse signal 33 of the partial discharge P being generated corresponds to.

As shown in FIG. 1, the partial discharge measurement system 1 includes: a first sensor 6; a second sensor 7; a first coaxial cable 8; a second coaxial cable 9; a first bandpass filter 11; a second bandpass filter 12; a first amplifier 13; a second amplifier 14; a first A/D converter 15; a second A/D converter 16; and a data processing apparatus 17.

Figure 2:
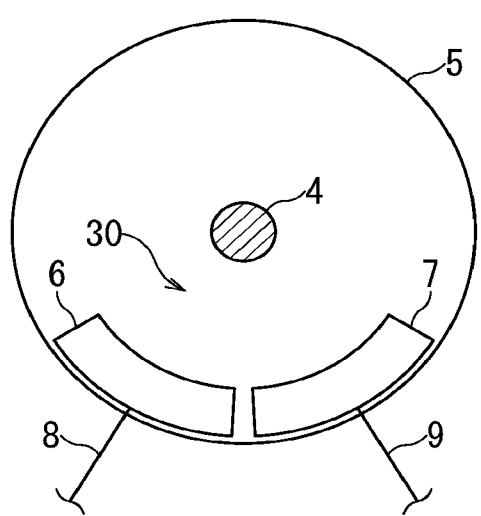
FIG. 2 is a cross-sectional view of a metal frame.

As shown in FIG. 2, the first sensor 6 and the second sensor 7 are provided on the inner peripheral surface of the metal frame 5. A gap 30 is provided between: the power line 4 provided in the center of the metal frame 5; and the first and second sensors 6 and 7. In other words, each of the first sensor 6 and the second sensor 7 detects the voltage signal propagating through the power line 4 (conductor) connected to the rotating electrical machine 2 in a non-contact manner. Since the first sensor 6 and the second sensor 7 are of non-contact type, even if the data processing apparatus 17 suffers a failure such as a short circuit and a ground fault, the operation of the rotating electrical machine 2 is not affected.

As shown in FIG. 1, the first sensor 6 is connected to the first bandpass filter 11 via the first coaxial cable 8 as a signal line. The voltage signal detected by this first sensor 6 is inputted to the first bandpass filter 11. The second sensor 7 is connected to the second bandpass filter 12 via the second coaxial cable 9 as a signal line. The voltage signal detected by this second sensor 7 is inputted to the second bandpass filter 12.

The first bandpass filter 11 is a high-pass filter through which high frequency components pass. This first bandpass filter 11 causes the component of the first frequency, which is included in the voltage signal acquired by the first sensor 6, to pass through itself. This first sensor 6 detects the voltage signal of the partial discharge P.

The second bandpass filter 12 is a low-pass filter through which low frequency components pass. This second bandpass filter 12 causes the component of the second frequency, which is included in the voltage signal acquired by the second sensor 7, to pass through itself. This second sensor 7 detects the phase waveform 31 of the commercial power supply.

The second frequency is lower than the first frequency. This second frequency is set on the basis of the frequency of the commercial power supply. In this manner, the phase waveform 31 of the commercial power supply, which serves as an index for identifying the component (waveform) of the partial discharge P, can be acquired.

The second frequency is set within the range of 1 Hz to 180 Hz. As a result of trial production and experimentation of various aspects of the partial discharge measurement system 1, the inventors have found that it is preferable to set the second frequency within the range of 1 Hz to 180 Hz. For example, in consideration of 60 Hz which is the frequency of the commercial power supply, even if some errors occur, the phase waveform 31 of the commercial power supply can be acquired as an index for identifying the component of the partial discharge P by setting the second frequency to the maximum of 180 Hz, which is about three times as high as 60 Hz, or lower.

The second frequency may be any other frequency. For example, when the frequency of the commercial power supply is 50 Hz, in consideration of an error of about 10%, the second frequency may be set within the range of 45 Hz to 55 Hz. When the frequency of the commercial power supply is 60 Hz, the second frequency may be set within the range of 54 Hz to 66 Hz. Furthermore, the second frequency may be set within the range of 45 Hz to 66 Hz so that any frequency of the commercial power supply can be used.

The first frequency can be any value as long as it is higher than the second frequency. For example, the first frequency is set within the range of 200 Hz to 1 GHz. It is satisfactory if the lower limit of the first frequency is a value higher than 180 Hz. Further, the lower limit of the first frequency is preferably 1 kHz or more in the case of sufficiently blocking the components irrelevant to the partial discharge P. The upper limit of the time resolution of the digital signal to be processed by the data processing apparatus 17 may be the upper limit of the first frequency.

Providing the partial discharge measurement system 1 with the first and second sensors 6 and 7 facilitates processing of the voltage signals of two different frequency components, which are acquired as the voltage signal of the partial discharge P and as the phase waveform 31 of the commercial power supply.

The first amplifier 13 and the second amplifier 14 are provided for amplifying the voltage signals so as to enable measurement by the data processing apparatus 17. In addition, the first A/D converter 15 and the second A/D converter 16 are provided so as to convert continuous analog signals into discretized digital signals. Each voltage signal converted here is inputted to the data processing apparatus 17.

Figure 3:
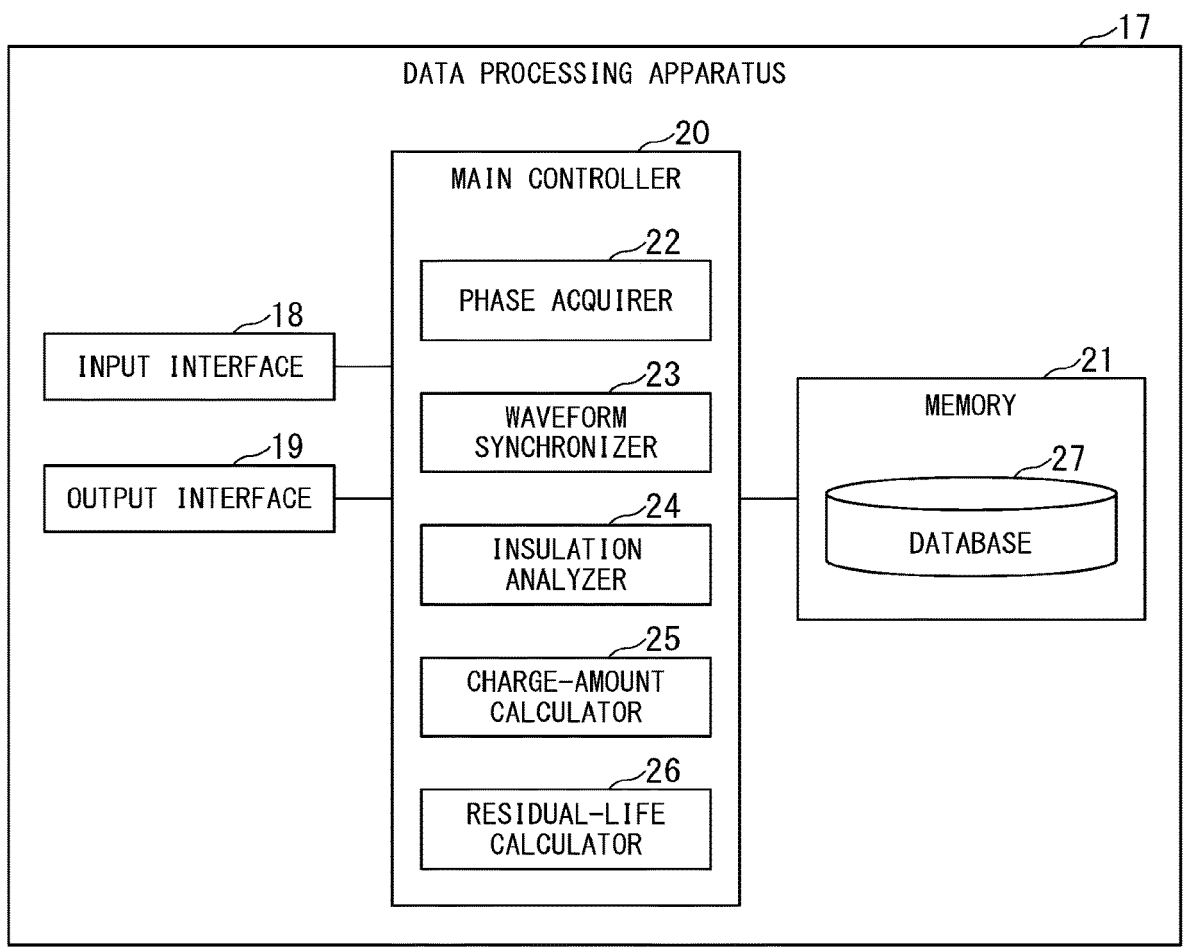
FIG. 3 is a block diagram of a data processing apparatus.

Next, the system configuration of the data processing apparatus 17 will be described by referring to the block diagram shown in FIG. 3. The data processing apparatus 17 includes: an input interface 18; an output interface 19; a main controller 20;
and a memory 21. The data processing apparatus 17 of the present embodiment includes hardware resources such as a Central Processing Unit (CPU), a Read Only Memory (ROM), a Random Access Memory (RAM) and/or a Hard Disk Drive (HDD), and is configured as a computer in which information processing by software is achieved with the use of the hardware resources by causing the CPU to execute various programs. Further, the partial discharge measurement method of the present embodiment is achieved by causing the computer to execute the various programs.

The voltage signals detected by the sensors 6 and 7 are inputted to the input interface 18. For example, digital signals converted by the A/D converters 15 and 16 are inputted to the input interface 18. The input to the input interface 18 is not limited to the aspect in which the voltage signals are inputted from the sensors 6 and 7 in real time but may be input in another aspect. For example, the voltage signals detected by the sensors 6 and 7 may be once stored by another recording device, and then the voltage signals stored by this recording device may be inputted to the input interface 18 of the data processing apparatus 17.

Predetermined information is inputted to the input interface 18 in response to the operation by the user who uses the system. The input interface 18 includes an input device such as a mouse, and a keyboard. That is, the predetermined information is inputted to the input interface 18 depending on the operation on these input devices.

The output interface 19 outputs the predetermined information. This output interface 19 controls images to be displayed on a display. The display may be separated from the main body of the computer or may be integrated with the main body of the computer. Additionally or alternatively, the output interface 19 may control images to be displayed on the display of other computers interconnected via the network.

Although the display is exemplified as a device for displaying an image in the present embodiment, display of an image may be executed by other methods. For example, the image may be displayed using a printer configured to print information on a paper medium may be used instead of the display. That is, the printer may be included in an object to be controlled by the output interface 19.

The main controller 20 integrally controls the partial discharge measurement system 1. This main controller 20 includes: a phase acquirer 22; a waveform synchronizer 23; an insulation analyzer 24; a charge-amount calculator 25; and a residual-life calculator 26. These are implemented by causing its the CPU to execute the programs stored in the memory or an HDD.

Each configuration of the data processing apparatus 17 does not necessarily have to be provided on one computer. For example, one data processing apparatus 17 may be achieved by using a plurality of computers interconnected by a network in combination. For example, the insulation analyzer 24, the charge-amount calculator 25 and the residual-life calculator 26 may be individually installed in respective each of computers.

The memory 21 stores various information items that are necessary for performs the insulation diagnosis of the rotating electrical machine 2. The memory 21 has a database 27. This database 27 is collection of organized information items stored in the memory, the HDD and/or resources of cloud computing in such a manner that a necessary information item can be searched and a further information item can be added.

The database 27 stores residual life information that indicates the relationship between the charge amount related to the partial discharge P of the rotating electrical machine 2 and the residual life of the rotating electrical machine 2. In this manner, the residual life information can be accumulated in the database 27 in advance, and the residual life of the rotating electrical machine 2 can be calculated on the basis of this accumulation.

Figure 4:
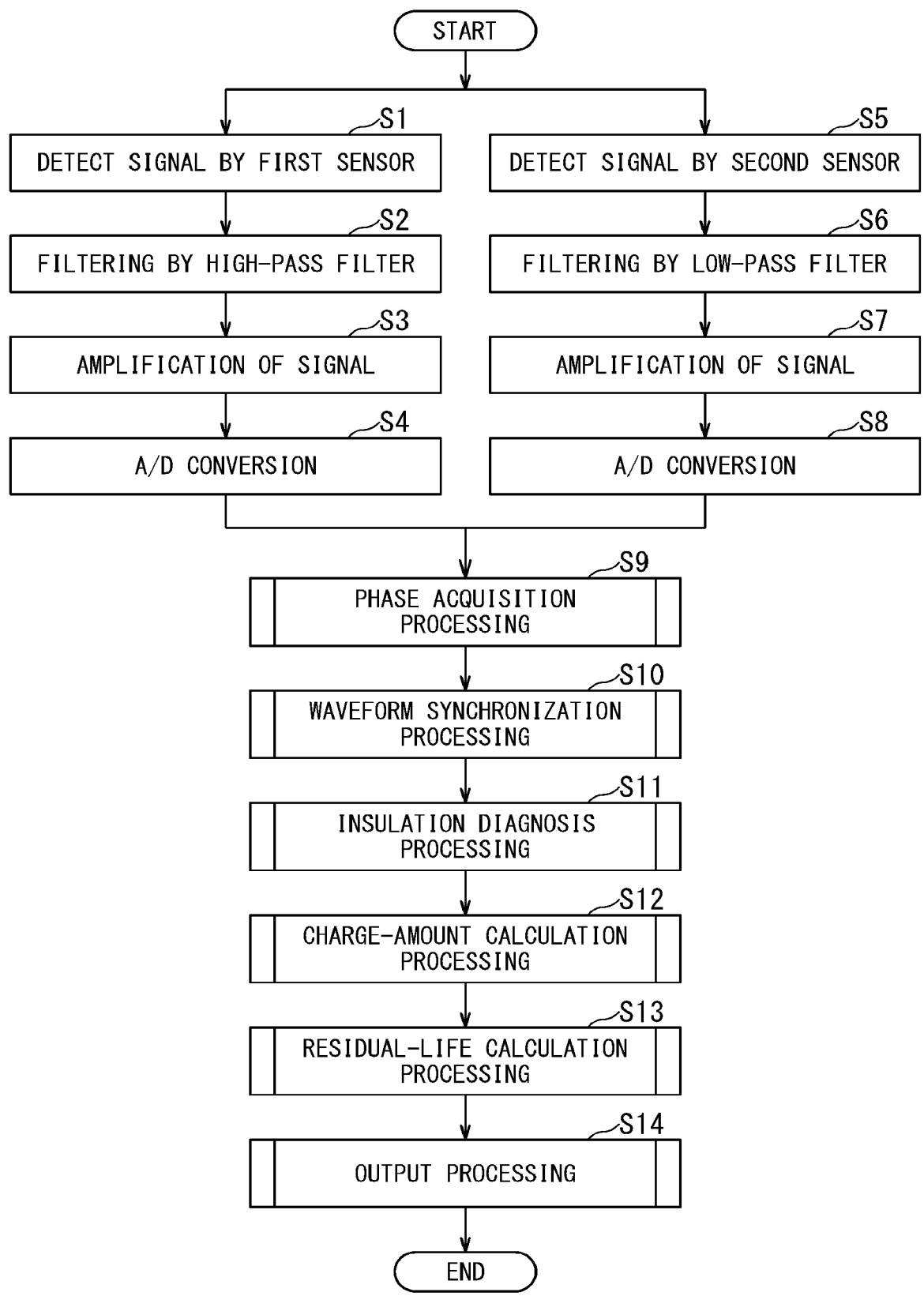
FIG. 4 is a flowchart illustrating a partial discharge measurement method.

Next, the partial discharge measurement method to be performed by the partial discharge measurement system 1 will be described on the basis of the flowchart of FIG. 4 by referring to the above-described figures as appropriate.

In the first step S1, the first sensor 6 detects the voltage signal propagating through the power line 4 (conductor) connected to the rotating electrical machine 2 in a non-contact manner.

In the next step S2, the first bandpass filter 11 (high pass filter) causes the component of the first frequency (high frequency), which is included in the voltage signal acquired by the first sensor 6, to pass through itself.

In the next step S3, the first amplifier 13 amplifies the voltage signal that has passed through the first bandpass filter 11.

In the next step S4, the first A/D converter 15 converts the voltage signal having passed through the first bandpass filter 11 from an analog signal to a digital signal, and then the processing proceeds to the step S9.

Further, in the partial discharge measurement method of the present embodiment, the processing of the steps S5 to S8 is executed in parallel with the processing of the steps S1 to S4.

First, in the first step S5, the second sensor 7 detects the voltage signal propagating through the power line 4 (conductor) connected to the rotating electrical machine 2 in a non-contact manner.

In the next step S6, the second bandpass filter 12 (low-pass filter) causes the component of the second frequency (low frequency), which is included in the voltage signal acquired by the second sensor 7, to pass through itself.

In the next step S7, the second amplifier 14 amplifies the voltage signal that has passed through the second bandpass filter 12.

In the next step S8, the second A/D converter 16 converts the voltage signal having passed through the second bandpass filter 12 from an analog signal to a digital signal, and then the processing proceeds to the step S9.

In the step S9 subsequent to the above-described steps S4 and S8, the phase acquirer 22 performs phase acquisition processing. Here, the phase acquirer 22 acquires the phase waveform 31 of the component of the second frequency having passed through the second bandpass filter 12. For example, processing of generating the phase waveform 31 is performed. This phase waveform 31 is the waveform of the commercial power supply.

In the next step S10, the waveform synchronizer 23 performs waveform synchronization processing. Here, the waveform synchronizer 23 synchronizes the waveform of the first frequency with the phase waveform 31. For example, the processing of superimposing the waveform of the first frequency and the phase waveform 31 on each other is performed. As to the aspect after the synchronization, it is satisfactory if the relationship between the voltage signal of the partial discharge P and the region 32 where the voltage rises in the phase waveform 31 can be grasped by the aspect after the synchronization. This facilitates identification of the location where the waveform including the component (waveform) of the partial discharge P appears in the waveform of the first frequency.

In the next step S11, the insulation analyzer 24 performs insulation diagnosis processing. Here, the insulation analyzer 24 performs the insulation diagnosis of the rotating electrical machine 2 on the basis of the component of the partial discharge P, which is identified on the basis of the phase waveform 31.

In the insulation diagnosis processing, the insulation analyzer 24 acquires information which are data indicating characteristics of the discharge, such as discharge occurrence conditions, necessary for identifying a discharge occurrence position and/or the cause of the discharge. In this manner, the insulation diagnosis of the rotating electrical machine 2 can be performed.

In the next step S12, the charge-amount calculator 25 performs charge-amount calculation processing. Here, the charge-amount calculator 25 calculates the charge amount related to the partial discharge P of the rotating electrical machine 2 on the basis of the component of the partial discharge P, which is identified on the basis of the phase waveform 31.

In the charge-amount calculation processing, for example, the charge amount related to the partial discharge P is calculated on the basis of the peak value of the waveform including the component of the partial discharge P. In addition, the charge amount related to the partial discharge P maybe calculated on the basis of a spectrum of a section corresponding to local discharge of the waveform including the component of the partial discharge P.

The information on the charge amount is important information for knowing the absolute discharge intensity. Thus, the deterioration state of the rotating electrical machine 2 can be determined by evaluating the magnitude of the charge amount. Further, the relationship between the discharge intensity and the discharge frequency can be diagnosed by combining the information on the charge amount and the occurrence location of the waveform including the component of the partial discharge P at the first frequency. Accurate estimation of the life of the rotating electrical machine 2 can be achieved by comprehensively evaluating those information items.

In the next step S13, the residual-life calculator 26 performs residual-life calculation processing. Here, the residual-life calculator 26 calculates the residual life of the rotating electrical machine 2 from the residual life information stored in the database 27 and the charge amount related to the partial discharge P.

In the residual-life calculation processing, for example, on the basis of the information on the charge amount stored in the memory 21, a graph of the first characteristic data indicating the characteristics of the charge amount related to the partial discharge and the second characteristic data indicating the characteristics of the usage period (time) acquired from the current rotating electrical machine 2 is generated. Further, dielectric breakdown characteristics (Breakdown Voltage: BDV) indicating the relationship between the usage period and the residual life of the rotating electrical machine 2 is estimated by associating the first characteristic data with the second characteristic data.

On the basis of the second characteristic data, the time length until the charge amount related to the partial discharge reaches the preset threshold value is calculated as the residual life. In this manner, the second characteristic data of the current rotating electrical machine 2 include the characteristics that define its residual life, and thus, the calculation accuracy of the residual life can be improved.

In addition, the database 27 stores the characteristics that define the residual life of the rotating electrical machine 2. For example, the characteristics include the progress rate of the dielectric breakdown path. The dielectric breakdown path is initiated or progressed by the partial discharge related to the insulating material.

The dielectric breakdown path progresses with time, and when the dielectric breakdown path reaches the ground point, it causes dielectric breakdown. The information items on the charge amount and the progress function of the progress rate of the dielectric breakdown path are acquired in advance. On the basis of this progress function, the progress rate of the dielectric breakdown path can be successively acquired. In this manner, the residual life of the rotating electrical machine 2 can be calculated.

In the next step S14, the main controller 20 performs output processing. Here, the main controller 20 uses the output interface 19 to output the processing results of the data related to the partial discharge P. For example, the output interface 19 displays the processing results on the display or outputs the processing results to the printer. The processing results may be sent to another computer or may be recorded on a portable recording medium.

The processing results to be outputted from the output interface 19 include: information indicating whether the partial discharge P has occurred or not; a graph in which the waveform of the first frequency and the phase waveform 31 are superimposed on each other; an insulation diagnosis result of the rotating electrical machine 2; the charge amount related to the partial discharge P; the residual life of the rotating electrical machine 2; and the like.

The information on occurrence/non-occurrence of the partial discharge P does not necessarily have to be information acquired by causing the data processing apparatus 17 to determine whether the partial discharge P has occurred or not. For example, a graph in which the waveform of the first frequency and the phase waveform 31 are superimposed may be outputted, and a user viewing this graph may determine whether the partial discharge P has occurred or not. In other words, the output interface 19 outputs information by which the component of the partial discharge P of the rotating electrical machine 2 included in the component of the first frequency having passed through the first bandpass filter 11 can be identified on the basis of the phase waveform 31, and the partial discharge measurement method is completed.

(Second Embodiment) Next, the partial discharge measurement system 1A and the partial discharge measurement method according to the second embodiment will be described by referring to FIG. 6. The same components as those shown in the above-described embodiment are denoted by the same reference signs, and duplicate description is omitted.

The partial discharge measurement system 1A according to the second embodiment further includes a phase shifter 40 in addition to the configuration of the first embodiment. The phase shifter 40 may be installed anywhere as long as it is installed at least between the second bandpass filter 12 and the second A/D converter 16.

Since the electrostatic capacity of the gap 30 between the power line 4 as a conductor and the second sensor 7 is relatively small, the phase waveform 31' to be measured by the second sensor 7 deviates from the phase waveform 31 of the commercial power supply to be outputted from the coil 3 in some cases. For example, as shown in FIG. 5, the phase waveform 31' to be measured by the second sensor 7 has a predetermined phase difference θ with respect to the original phase waveform 31 of the commercial power supply. For this reason, in the second embodiment, the original phase waveform 31 of the commercial power supply is acquired by correcting the phase difference θ.

Figure 6:
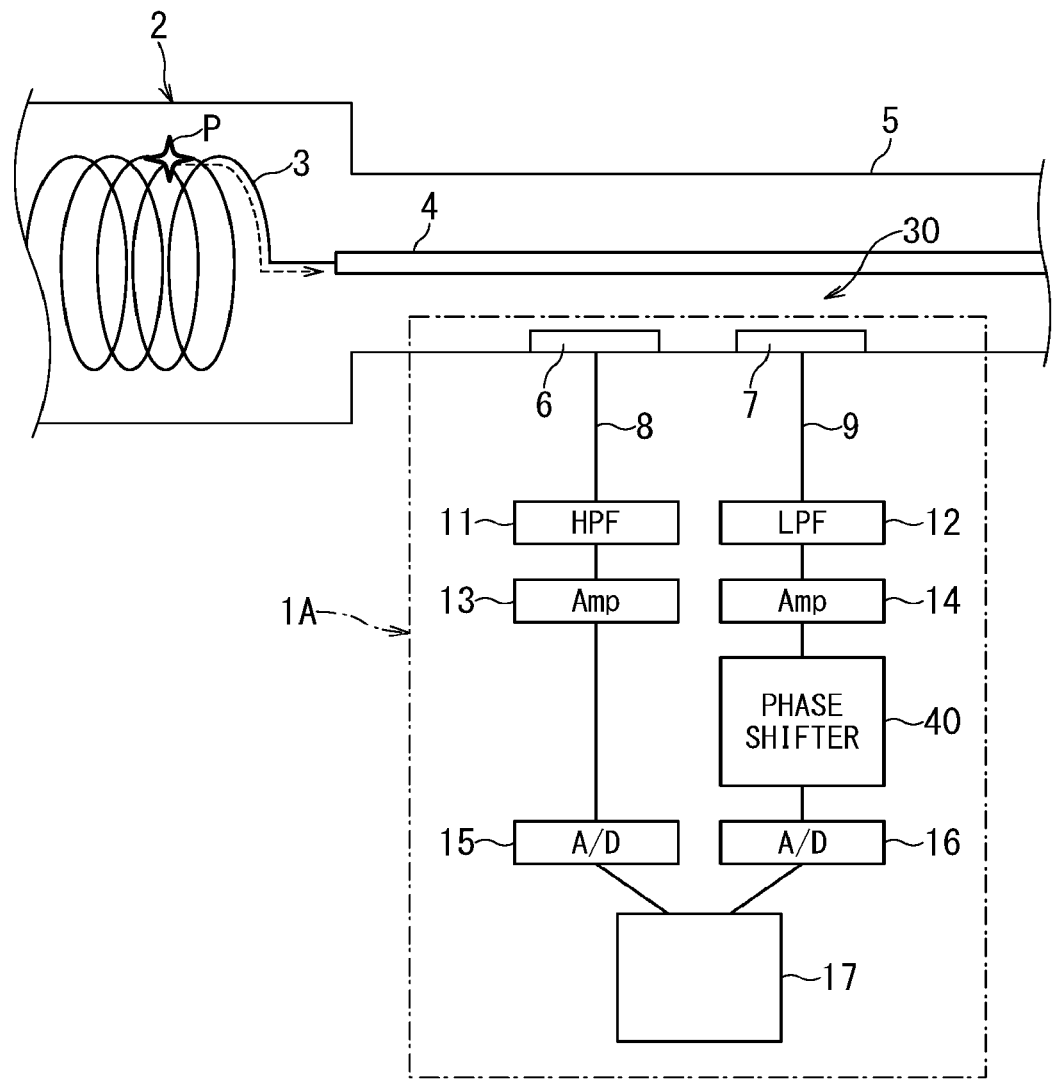
FIG. 6 is a configuration diagram illustrating the partial discharge measurement system according to the second embodiment.

As shown in FIG. 6, the portion of the gap 30 between the power line 4 (conductor) and the second sensor 7 can be regarded as a virtual phase-advance circuit (phase-advance capacitor) having a predetermined electrostatic capacity. This causes a phase difference θ (FIG. 5). For this reason, the phase shifter 40 constituting a phase delay circuit that opposes the phase-advance circuit is provided. In this manner, the phase shifter 40 can cancel the phase advance component in terms of electric circuit and correct the phase difference θ.

In the second embodiment, a virtual circuit including at least the electrostatic capacity of the gap 30 between the power line 4 (conductor) and the second sensor 7 (for example, circuitry including the above-described phase-advance circuit and the phase-delay circuit) is analyzed in advance, and correction amount for correcting the phase difference θ (deviation) of the phase waveform 31' is set on the basis of this analysis. In this manner, appropriate correction amount can be set.

(Third Embodiment) Next, the partial discharge measurement system 1B and the partial discharge measurement method according to the third embodiment will be described by referring to FIG. 7 and FIG. 8. The same components as those in the above-described embodiments are denoted by the same reference signs, and duplicate description is omitted.

Figure 7:
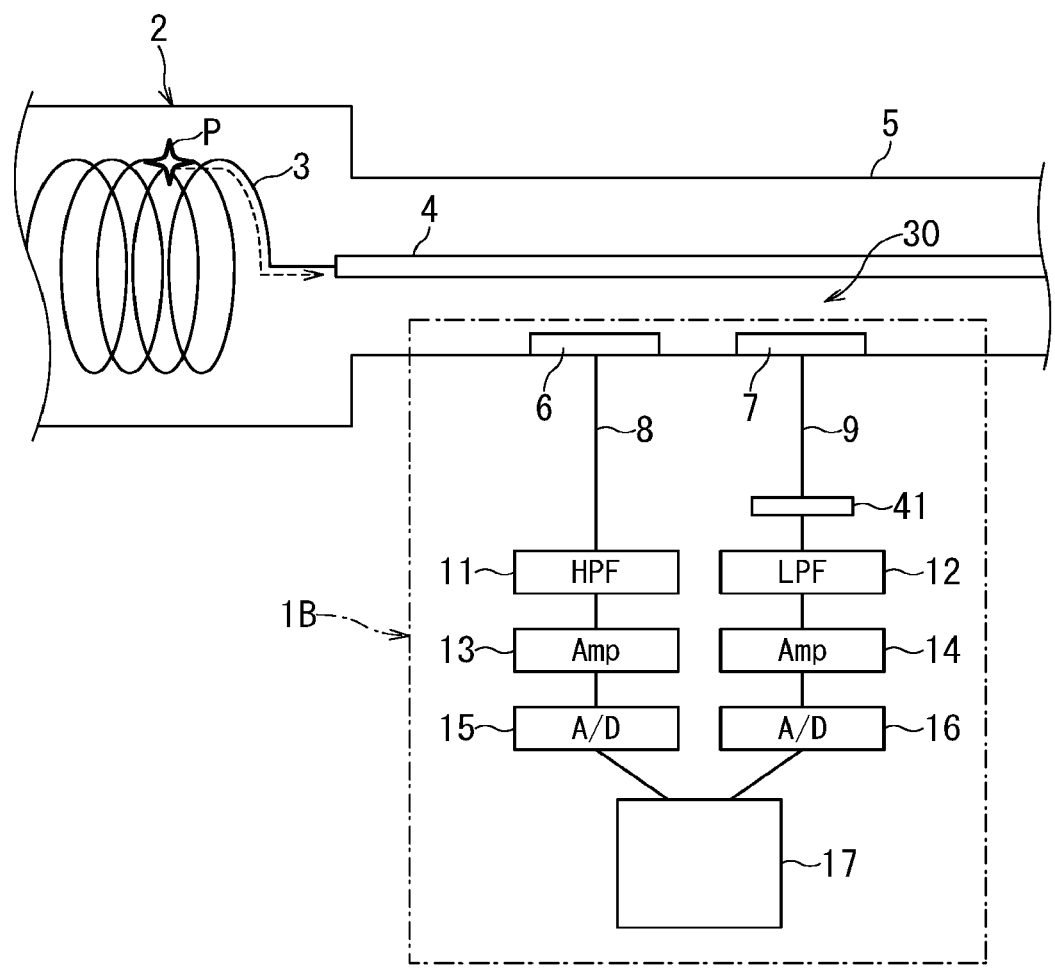
FIG. 7 is a configuration diagram illustrating the partial discharge measurement system according to the third embodiment.

As shown in FIG. 7, the partial discharge measurement system 1B according to the third embodiment further includes a correction capacitor 41 in addition to the configuration of the above-described first embodiment. This correction capacitor 41 is provided to correct the above-described phase difference θ (FIG. 5).

The correction capacitor 41 is provided on the second coaxial cable 9, which is the signal line connecting the second sensor 7 and the second bandpass filter 12.

Figure 8:
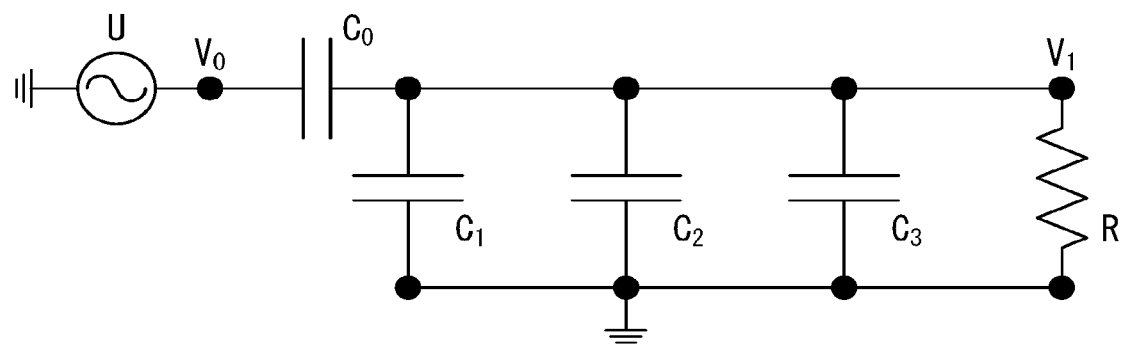
FIG. 8 is a circuit diagram illustrating a virtual circuit including electrostatic capacity of a gap between a conductor and the sensor.

As shown in FIG. 8, in the third embodiment, the correction amount for correcting the phase difference θ of the phase waveform 31 of the commercial power supply is set on the basis of the analysis of a virtual circuit (equivalent circuit) that includes at least: the electrostatic capacity $C_0$ of the gap 30 between the power line 4 (conductor) and the second sensor 7; and the resistance value R of the data processing apparatus 17 that processes the voltage signals.

For example, the voltage of the commercial power supply U is defined as $V_0$ and the voltage of the data processing apparatus 17 is defined as $V_1$. Here, the electrostatic capacity of the gap 30 is defined as $C_0$, the electrostatic capacity of the second sensor 7 is defined as $C_1$, the electrostatic capacity of the second coaxial cable 9 is defined as $C_2$, the electrostatic capacity of the correction capacitor 41 is defined as $C_3$, and the resistance value (impedance) of the data processing apparatus 17 is defined as R.

The electrostatic capacity $C_0$ of the gap 30 is the electrostatic capacity between the power line 4 (conductor) and the metal frame 5. The electrostatic capacity $C_1$ of the second sensor 7 is the electrostatic capacity between the second sensor 7 and the metal frame 5. In addition, the resistance value R includes the resistance values of the second bandpass filter 12, the second amplifier 14, and the second A/D converter 16.

The electrostatic capacity $C_1$ of the second sensor 7, the electrostatic capacity $C_2$ of the second coaxial cable 9, the electrostatic capacity $C_3$ of the correction capacitor 41, and the resistance value R of the data processing apparatus 17 constitute a parallel circuit between the ground point and the electrostatic capacity $C_0$ of the gap 30.

Under the assumption that the electrostatic capacity $C_3$ of the correction capacitor 41 does not exist, the electric current flows more easily on the side of the resistance value R than on the side of the electrostatic capacities $C_1$ and $C_2$. Thus, the phase difference θ (FIG. 5) is generated. For this reason, the electrostatic capacity $C_3$ of the correction capacitor 41 is provided in such a manner that the electric current flows more on the side of the electrostatic capacities $C_1$, $C_2$, and $C_3$ and flows less on the side of the resistance value R. In this manner, the phase difference θ (FIG. 5) can be canceled.

The electrostatic capacity $C_3$ of the correction capacitor 41 is a prescribed multiple of the ground electrostatic capacity or more. The electrostatic capacity $C_3$ (correction amount) of the correction capacitor 41 being a prescribed multiple or more of the ground electrostatic capacity is determined by calculation depending on the above-described virtual circuit (equivalent circuit).

The partial discharge measurement system 1B according to the third embodiment includes the correction capacitor 41 that is provided between the signal line and the ground point and corrects the phase difference θ of the phase waveform 31'. In this manner, the phase difference θ of the phase waveform 31' can be corrected by a simple configuration in which only the correction capacitor 41 is added.

As above, although the partial discharge measurement system 1 (1A, 1B) and the partial discharge measurement method have been described on the basis of the first to third embodiments, the configuration applied in any one of the embodiments maybe applied to other embodiments or the configurations in the respective embodiments may be applied in combination.

The system in the present embodiment includes a storage device such as a Read Only Memory (ROM) and a Random Access Memory (RAM), an external storage device such as a Hard Disk Drive (HDD) and a Solid State Drive (SSD), a display device such as a display panel, an input device such as a mouse and a keyboard, a communication interface, and a control device which has a highly integrated processor such as a Central Processing Unit (CPU), a Graphics Processing Unit (GPU), a Field Programmable Gate Array (FPGA), and a special-purpose chip. The system can be achieved by hardware configuration with the use of a normal computer.

Note that each program executed in the system of the present embodiment is provided by being incorporated in a memory such as the ROM in advance. Additionally or alternatively, each program may be provided by being stored as a file of installable or executable format in a non-transitory computer-readable storage medium such as a CD-ROM, a CD-R, a memory card, a DVD, and a flexible disk (FD).

In addition, each program executed in the system may be stored on a computer connected to a network such as the Internet and be provided by being downloaded via a network. Further, the system can also be configured by interconnecting and combining separate modules, which independently exhibit respective functions of the components, via a network or a dedicated line.

Although the partial discharge measurement system 1 is provided with two sensors including the first sensor 6 and the second sensor 7 in the above-described embodiment, other aspects may be adopted. For example, the partial discharge measurement system 1 may be provided with one sensor. The voltage signals may be inputted to the first bandpass filter 11 and the second bandpass filter 12 by branching the coaxial cable extending from this one sensor.

Although a low-pass filter is used to extract the phase waveform 31 of the commercial power supply from the voltage signal in the above-described embodiment, other aspects may be adopted. For example, the phase waveform 31 of the commercial power supply maybe extracted from the voltage signal by processing the voltage signal in an electric circuit without using a low-pass filter.

According to at least one embodiment described above, the phase acquirer 22 configured to acquire the phase waveform 31 of the component of the second frequency having passed through the second bandpass filter 12 is provided, and thereby, measurement of the partial discharge P can be performed without affecting the operation of the rotating electrical machine 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

The invention claimed is:

1. A partial discharge measurement system comprising:
   at least one sensor configured to detect a voltage signal propagating through a conductor connected to a rotating electrical machine in a non-contact manner;
   a first bandpass filter, connected to the at least one sensor, configured to pass a component of a first frequency included in the voltage signal therethrough;
   a second bandpass filter, connected to the at least one sensor, configured to pass a component of a second frequency included in the voltage signal therethrough, the second frequency being lower than the first frequency;
   a phase acquirer configured to acquire a phase waveform of the component of the second frequency having passed through the second bandpass filter; and
   an output interface configured to output information by which a component of partial discharge of the rotating electrical machine included in the component of the first frequency having passed through the first bandpass filter can be identified based on the phase waveform.

2. The partial discharge measurement system according to claim 1, wherein the second frequency is set based on a frequency of a commercial power supply.

3. The partial discharge measurement system according to claim 2, further comprising:
   a converter configured to convert the voltage signal having passed through the second bandpass filter from an analog signal to a digital signal; and
   a phase shifter, interposed between the second bandpass filter and the converter, configured to correct a phase difference of the phase waveform compared to an original phase waveform having the frequency of the commercial power supply, wherein the phase acquirer is configured to acquire the phase waveform having been corrected in the phase difference by the phase shifter.

4. The partial discharge measurement system according to claim 3, wherein a correction amount for correcting the phase difference of the phase waveform is set based on analysis of the phase shifter constituting a phase-delay circuit opposite to a virtual phase-advance circuit including at least electrostatic capacity of a gap between the conductor and the at least one sensor.

5. The partial discharge measurement system according to claim 2, further comprising:
- a signal line that connects the at least one sensor and the second bandpass filter; and
- a correction capacitor, interconnected along the signal line, configured to correct a phase difference of the phase waveform compared to an original phase waveform having the frequency of the commercial power supply, wherein the phase acquirer is configured to acquire the phase waveform having been corrected in the phase difference by the correction capacitor.

6. The partial discharge measurement system according to claim 1, wherein the second frequency is set within a range of 1 Hz to 180 Hz.

7. The partial discharge measurement system according to claim 1, further comprising a waveform synchronizer configured to synchronize a waveform of the first frequency with the phase waveform.

8. The partial discharge measurement system according to claim 1, further comprising an insulation analyzer configured to perform insulation diagnosis of the rotating electrical machine based on the component of the partial discharge that is identified based on the phase waveform.

9. The partial discharge measurement system according to claim 1, further comprising:
- a charge amount calculator configured to calculate charge amount related to the partial discharge of the rotating electrical machine based on the component of the partial discharge that is identified based on the phase waveform;
- a database configured to store residual life information that indicates relationship between the charge amount and a residual life of the rotating electrical machine; and
- a residual life calculator configured to calculate the residual life of the rotating electrical machine from the residual life information stored in the database and the charge amount related to the partial discharge.

10. The partial discharge measurement system according to claim 1, wherein the at least one sensor comprises:
- a first sensor connected to the first bandpass filter; and
- a second sensor connected to the second bandpass filter.

11. A partial discharge measurement method comprising:
- causing at least one sensor to detect a voltage signal propagating through a conductor connected to a rotating electrical machine in a non-contact manner;
- causing a first bandpass filter connected to the at least one sensor to pass a component of a first frequency included in the voltage signal therethrough;
- causing a second bandpass filter connected to the at least one sensor to pass a component of a second frequency included in the voltage signal therethrough, the second frequency being lower than the first frequency;
- causing a phase acquirer to acquire a phase waveform of the component of the second frequency having passed through the second bandpass filter; and
- causing an output interface to output information by which a component of partial discharge of the rotating electrical machine included in the component of the first frequency having passed through the first bandpass filter can be identified based on the phase waveform.

* * * * *